`US005827997A`

United States Patent [19]
Chung et al.

[11] Patent Number: 5,827,997
[45] Date of Patent: Oct. 27, 1998

[54] METAL FILAMENTS FOR ELECTROMAGNETIC INTERFERENCE SHIELDING

[76] Inventors: Deborah D. L. Chung, 108 Rolling Meadow La., E. Amherst, N.Y. 14051; Xiaoping Shui, 187 Wendover Ave., Apt. 1, Tonawanda, N.Y. 14223

[21] Appl. No.: 328,266

[22] Filed: Sep. 30, 1994

[51] Int. Cl.$^6$ .................................................. H05K 9/00
[52] U.S. Cl. ...................................... 174/35 MS; 428/408
[58] Field of Search ................... 427/216, 217, 427/218, 219, 220, 249, 250, 255, 255.1, 255.7, 265, 269; 428/408; 174/35 MS

[56] References Cited

U.S. PATENT DOCUMENTS

| | | |
|---|---|---|
| 2,877,501 | 3/1959 | Bradt . |
| 4,097,624 | 6/1978 | Schladitz ............................... 427/251 |
| 4,481,249 | 11/1984 | Ebneth et al. .......................... 428/288 |
| 4,759,950 | 7/1988 | Stevens ................................... 427/35 |
| 4,818,615 | 4/1989 | Luxon et al. .......................... 428/407 |
| 4,983,456 | 1/1991 | Iwaskow et al. ....................... 428/254 |
| 5,162,271 | 11/1992 | Carpenter et al. ....................... 501/95 |
| 5,171,560 | 12/1992 | Tennent ................................ 423/447 |
| 5,200,370 | 4/1993 | Lennox et al. .......................... 501/95 |
| 5,234,715 | 8/1993 | Stevens et al. ........................ 427/250 |
| 5,286,524 | 2/1994 | Slutz et al. ............................. 427/249 |

*Primary Examiner*—Bot L. Ledynh

[57] ABSTRACT

A material including filaments, which include a metal and an essentially coaxial core, each filament having a diameter less than 6 μm, each core being essentially carbon, displays high effectiveness for shielding electromagnetic interference (EMI) when dispersed in a matrix to form a composite material. This matrix is selected from the group consisting of polymers, ceramics and polymer-ceramic combinations. This metal is selected from the group consisting of nickel, copper, cobalt, silver, gold, tin, zinc, nickel-based alloys, copper-based alloys, cobalt-based alloys, silver-based alloys, gold-based alloys, tin-based alloys and zinc-based alloys. The incorporation of 7 percent volume of this material in a matrix that is incapable of EMI shielding results in a composite that is substantially equal to copper in EMI shielding effectiveness at 1–2 GHz.

16 Claims, 14 Drawing Sheets

METAL FILAMENTS FOR ELECTROMAGNETIC INTERFERENCE SHIELDING

BACKGROUND OF THE INVENTION

1. Field of the Invention

This invention relates to a material comprising filaments, each filament having a diameter less than 2 μm and a length more than 100 μm, such that the use of this material as a filler provides composites with very high effectiveness for electromagnetic interference (EMI) shielding. This invention also relates to a process for making this material.

2. Description of the Prior Art

Electrically conducting polymer-matrix composites are used for electromagnetic interference (EMI) shielding, the need of which is increasingly important due to the increasing sensitivity and abundance of electronics. Polymer-matrix components, as opposed to monolithic metals, are attractive due to their moldability. They are attractive compared to metal-coated monlithic polymers due to the fact that the coatings are prone to damage by scratching, abrasion or wear. These composites are conducting due to the presence of an electrically conducting filler, which can be discontinuous (such as particles and short fibers) or continuous (such as continuous fibers). Discontinuous fillers are in general less effective than continuous fillers in decreasing the electrical resistivity of the composite. However, unlike electrical conduction, EMI shielding does not require continuity or percolation of the conducting phase, though continuity or percolation helps. Moreover, discontinuous fillers are suitable for composite fabrication by injection molding and, if the discontinuous filler is fine enough in size, even by ink jet printing or screen printing. Due to the lower cost and greater versatility of composite fabrication for discontinuous fillers compared to continuous fillers, discontinuous fillers are widely used for making electrically conducting composites, especially those for EMI shielding.

Discontinuous fillers that have been used in polymer matrices for EMI shielding include metal particles (e.g., Ni particles), metal flakes (e.g., Al flakes), carbon particles, (e.g., graphite and carbon black), carbon fibers, metal fibers (e.g., stainless steel fibers, nickel fibers), metal coated carbon particles, and metal coated carbon fibers (e.g., Ni coated carbon fibers). For any filler, the EMI shielding effectiveness increases with increasing filler volume fraction in the composite, but the maximum filler volume fraction is limited by the poor composite mechanical properties at high filler volume fractions resulting from the poor filler-matrix bonding. For materials and process cost saving and good mechanical properties, the attainment of a high shielding effectiveness at a low filler volume fraction is desirable. Because electromagnetic waves at high frequencies (such as microwaves) interact with a conductor only near its surface, a smaller unit size of the conducting filler enables a higher shielding effectiveness to be attained at the same filler volume fraction.

The only submicron diameter filament filler that has been previously used for EMI shielding is carbon filaments (catalytically grown from carbonaceous gases); a shielding effectiveness at 1 GHz of 45 dB was attained at a filler content of 60 wt. % (about 45 vol. %), see Makoto Katsumata, Hidenori Yamanashi, Hitoshi Ushijima and Morinobu Endo, SPIE Proc., Vol. 1916 (Smart Materials), edited by Vijay K. Varadan, 1993, p. 140–148. These carbon filaments are in contrast to conventional carbon fibers (made from pitch or polymer precursors), which typically have diameter in the range 7–11 μm. The coating of conventional carbon fibers with nickel has been previously shown to greatly increase the shielding effectiveness, so that a shielding effectiveness at 1 GHz of 76 dB was attained, see Mal Murthy, 4th Int. SAMPE Electronics Conference, Vol. 4 (Electronic Materials -- Our Future), edited by Ron W. Allred, Robert J. Martinez and Ken B. Wischmann, 1990, p. 806–818.

The nickel-coated carbon fibers (not filaments) in the prior art contain a very minor volume fraction of nickel, as the nickel coating is very thin compared to the diameter of the fiber. On the other hand, fibers that are all nickel are made in the prior art by either deformation processing (such as wire drawing) or melt processing, both of which are expensive processes compared to coating by metal plating. Moreover, the difficulty of deformation processing and melt processing increases with decreasing fiber diameter; fibers of diameter less than 2 μm either cannot be produced by these processes or can be produced only at high costs.

3. Objectives of the Invention

An objective of this invention is to provide a material comprising filaments, each filament having a diameter less than 2 μm, for use as a filler in composites for EMI shielding, such that the filament's fabrication is inexpensive and the EMI shielding effectiveness is superior to that of fillers in the prior art.

Another objective is to provide a filler in composites for EMI shielding, such that a high shielding effectiveness is attained even at a low filler volume fraction.

Yet another objective is to provide a process for making the said filament or filler.

SUMMARY OF THE INVENTION

There is provided a material in the form of a metal or metal-coated filament, having diameter less than 2 μm and length more than 100 μm, such that the incorporation of 7 vol. % of this material in a matrix that is incapable of electromagnetic interference shielding results in a composite plate that is about 3 mm thick and is capable of shielding electromagnetic interference at 1–2 GHz with an effectiveness of at least 65 dB.

There is also provided a process for making the said filament. This process comprises (i) washing the surface of carbon filaments that are made from carbonaceous gases with a solvent that is capable of removing polyaromatic hydrocarbons, and (ii) electroplating or electroless plating the resulting carbon filaments with a metal.

There is furthermore provided a composite comprising said filaments and a matrix, which is a polymer, a ceramic or a polymer-ceramic combination.

BRIEF DESCRIPTION OF THE DRAWINGS

For a better understanding of the invention, reference should be had to the accompanying drawings wherein.

DESCRIPTION OF THE EMBODIMENTS

EXAMPLE I

This example pertains to a nickel-coated carbon filament containing 94 vol. % Ni and 6 vol. % C, such that the coated filament had a diameter of 0.4 μm, compared to a diameter of 0.1 μm for the carbon filament which forms its core. Due to the large proportion of nickel, this filament is referred to as a nickel filament.

This example also pertains to a method of making said filaments.

Furthermore, this example pertains to a composite material comprising said filaments and a polymer.

Figure 1A:
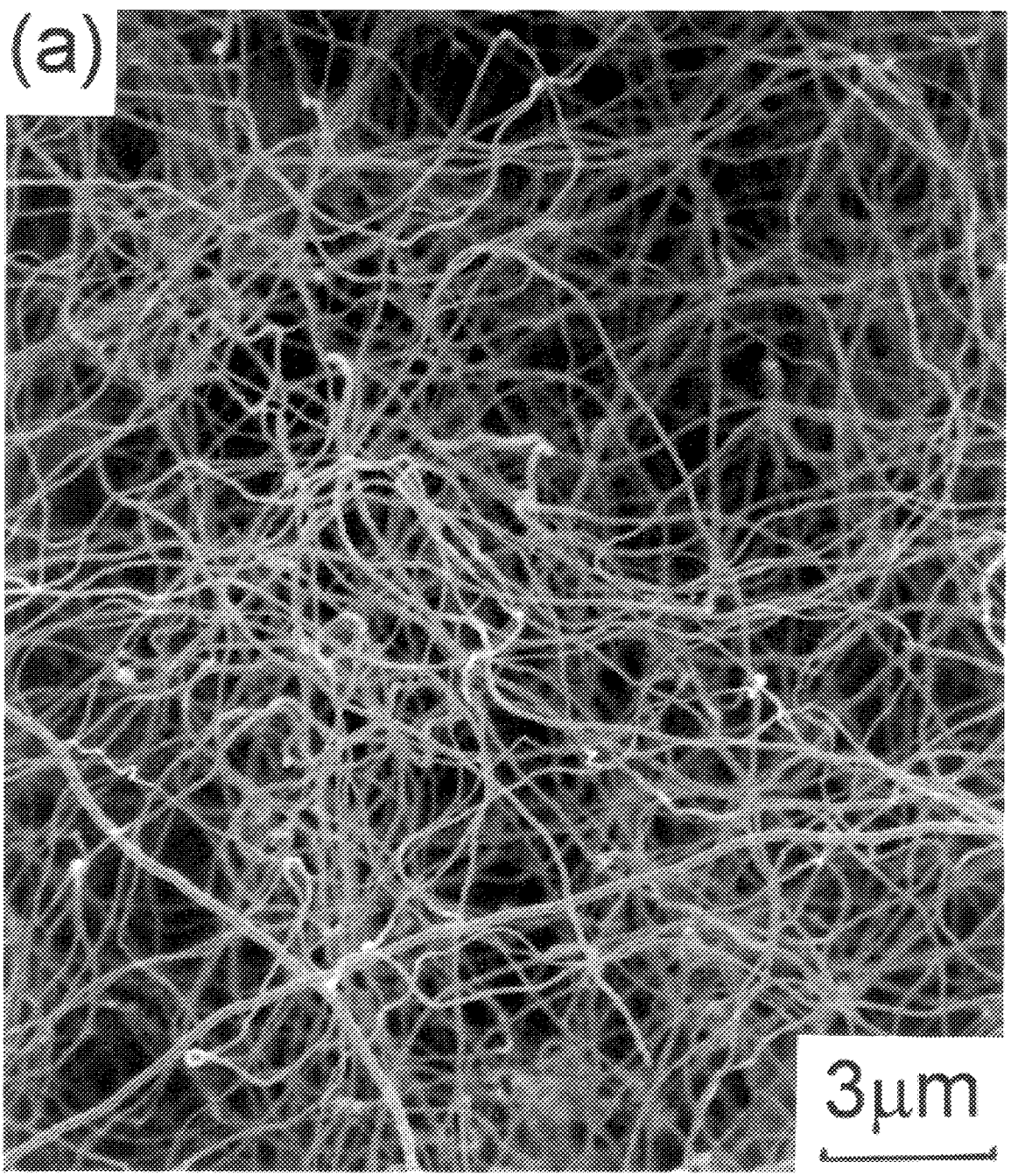
FIG. 1(a)–1(d) are scanning electron microscope (SEM) photographs. (a) and (b) show carbon filaments at two magnifications; (c) and (d) show nickel filaments at two magnifications.
Figure 1B:
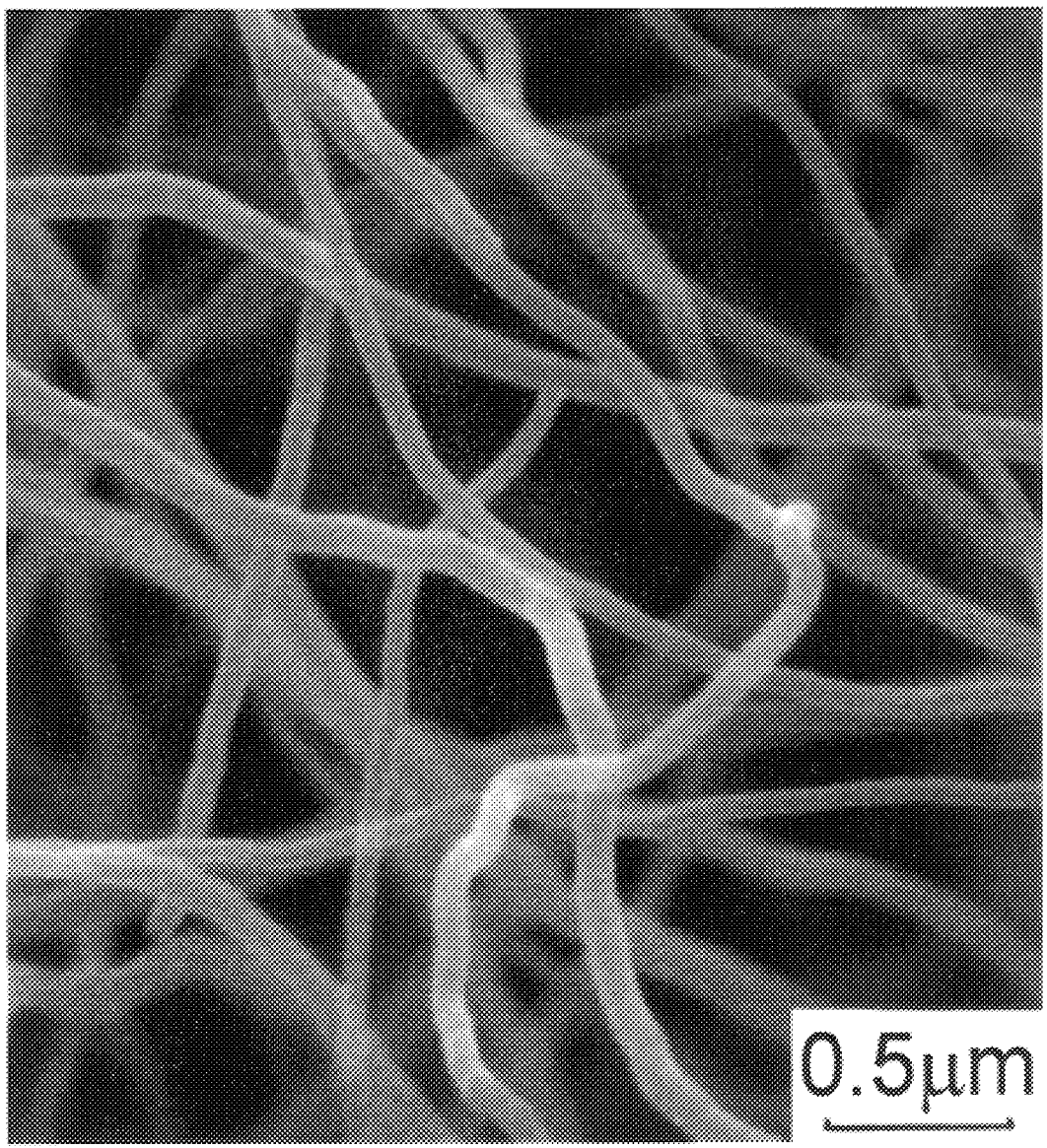
Figure 1C:
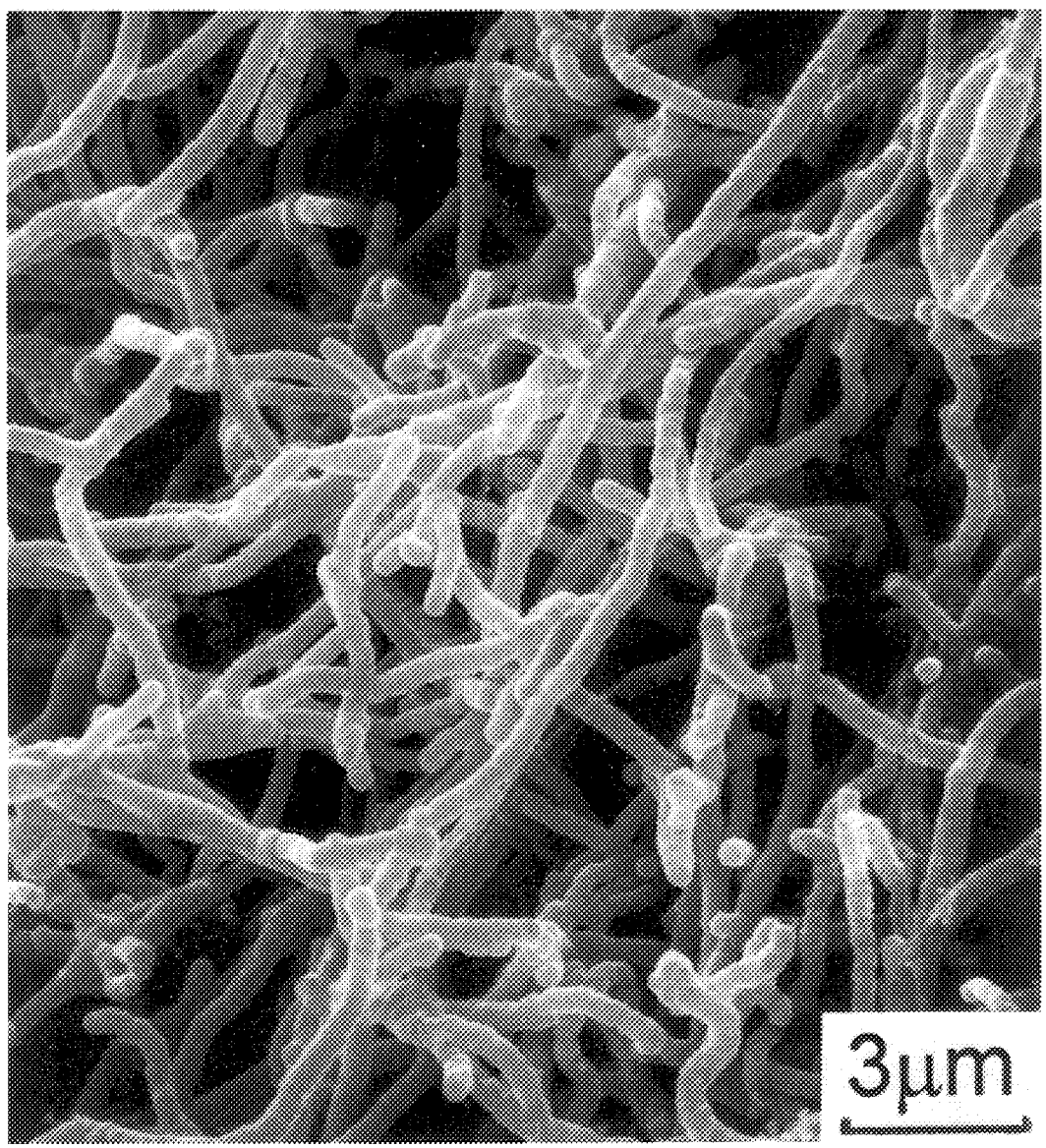
Figure 1D:
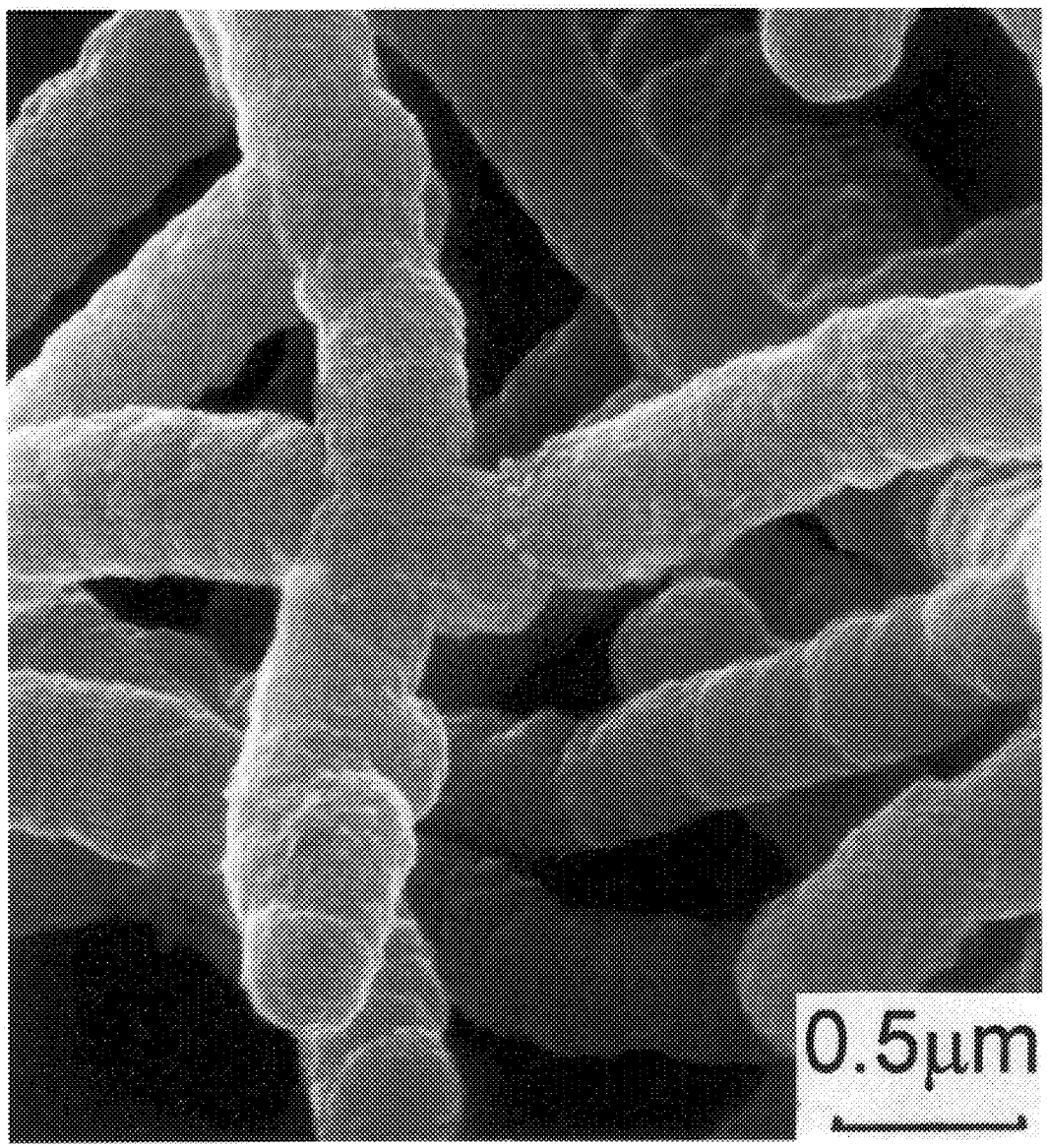

The nickel filament was 0.404±0.022 μm in diameter, such that it contained a carbon core of diameter 0.096±0.018 μm. Each nickel filament contained 94.4 vol. % Ni and 5.6 vol. % C. The carbon core was present because the nickel filaments were fabricated by the electroplating of nickel on to carbon filaments. The carbon filaments were provided as Grade ADNH by Applied Sciences, Inc. (Cedarville, Ohio). Prior to electroplating, the surface of the carbon filaments was treated by washing in acetone, which removed surface contaminants in the form of mainly polyaromatic hydrocarbons, as identified by mass spectrometry conducted in conjunction with gas chromatography. The hydrocarbons removed include pentadecane, tetradecane, aliphatic hydrocarbon, phenanthrene, fluoranthene, naphthalene and fluorenone. The surface contaminants were due to the process of making the carbon filaments by carbonaceous gases, as shown by the observation (also by mass spectrometry in conjunction with gas chromatography) of similar polyaromatic hydrocarbons in the tarry residue left on the wall of the carbon filament growth chamber after carbon filament growth. Without the treatment, the nickel coating was not uniform and resulted in composites orders of magnitude higher in electrical resistivity compared to the case with the treatment, see Xiaoping Shui and D. D. L. Chung, in Proc. Int. SAMPE Electronic Materials and Processes Conference, 7, Electronic Materials and Processes Revolution for a Peace Time World, 1994, p. 39–42, for the case without the treatment. This means that the surface contaminants affected the quality of the nickel coating, such that the electrical conduction path through the nickel coating became less continuous. The electroplating was conducted by using a nickel anode and a nickel sulfate electrolyte solution. The nickel in the nickel filaments was crystalline, as shown by x-ray diffraction using CuKα radiation. Because the carbon filaments were not straight, the resulting nickel filaments were also not straight, as shown in FIG. 1(a)–1(b) for the acetone-washed carbon filaments and in FIG. 1(c)–1(d) for the resulting nickel filaments. Due to the bent morphology and large aspect ratio, determination of the exact length of the carbon or nickel filaments was not possible. Nevertheless, a lower limit of the length was found by scanning electron microscopy (SEM) to be 100 μm. The submicron nature of either nickel or carbon filaments did not allow measurement of the electrical resistivity of single filaments.

The polymer used for all composites was polyether sulfone (PES), a thermoplastic provided as Victrex PES 4100P by ICI. Its properties are shown in Table I. The nickel fibers used for comparing with the nickel filaments were (i) 2 μm in diameter and 2000 μm in length, as provided by Ribtec (Gahanna, Ohio), and (ii) 20 μm in diameter and 1000 μm in length, as provided as Fibrex by National-Standard Co. (Corbin, Ky.). Due to the large length of the nickel fibers of diameter 2 μm (which resemble cotton wool), the dispersion of these fibers were most difficult. The carbon filaments used for comparing with the nickel filaments were 0.1 μm in diameter and >100 μm in length, as provided as Applied Sciences, Inc. (Cedarville, Ohio).

The composites were fabricated by forming a dry mixture of the polymer powder and the filler and subsequent hot pressing in a steel mold at 310° C. (processing temperature for PES, as recommended by ICI) and 13.4 MPa for ~30 min. For the nickel filaments and the 20 μm diameter Ni fibers, the mixing was carried out dry in a ball mill. For the carbon filaments, mixing was carried out wet—with water in a blender, and then the wet mix was dried at 120° C. For the 2 μm diameter Ni fibers, mixing was performed by hand, as neither the abovementioned dry mixing nor wet mixing was possible.

Figure 2:
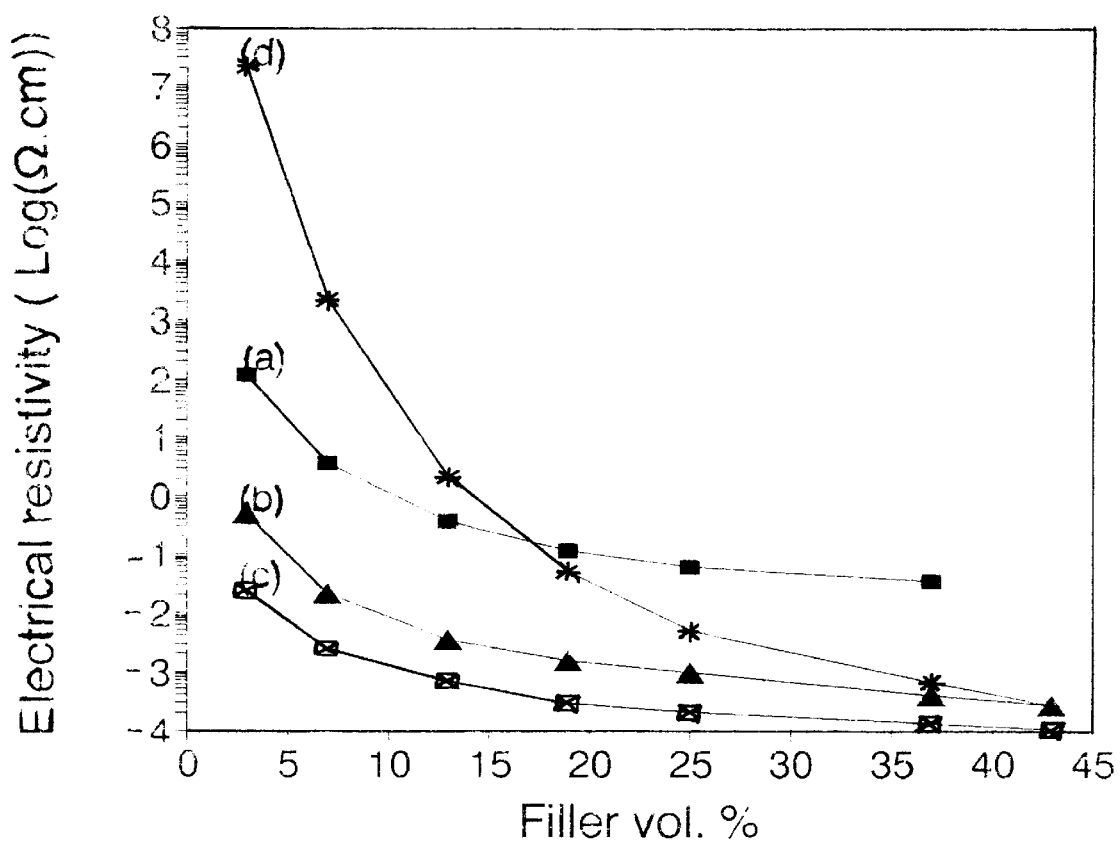
FIG. 2 is a graph showing the variation of the volume electrical resistivity of composites with filler volume fraction. (a) Carbon filaments. (b) Nickel filaments. (c) Nickel fibers of diameter 2 μm. (d) Nickel fibers of diameter 20 μm.
Figure 3A:
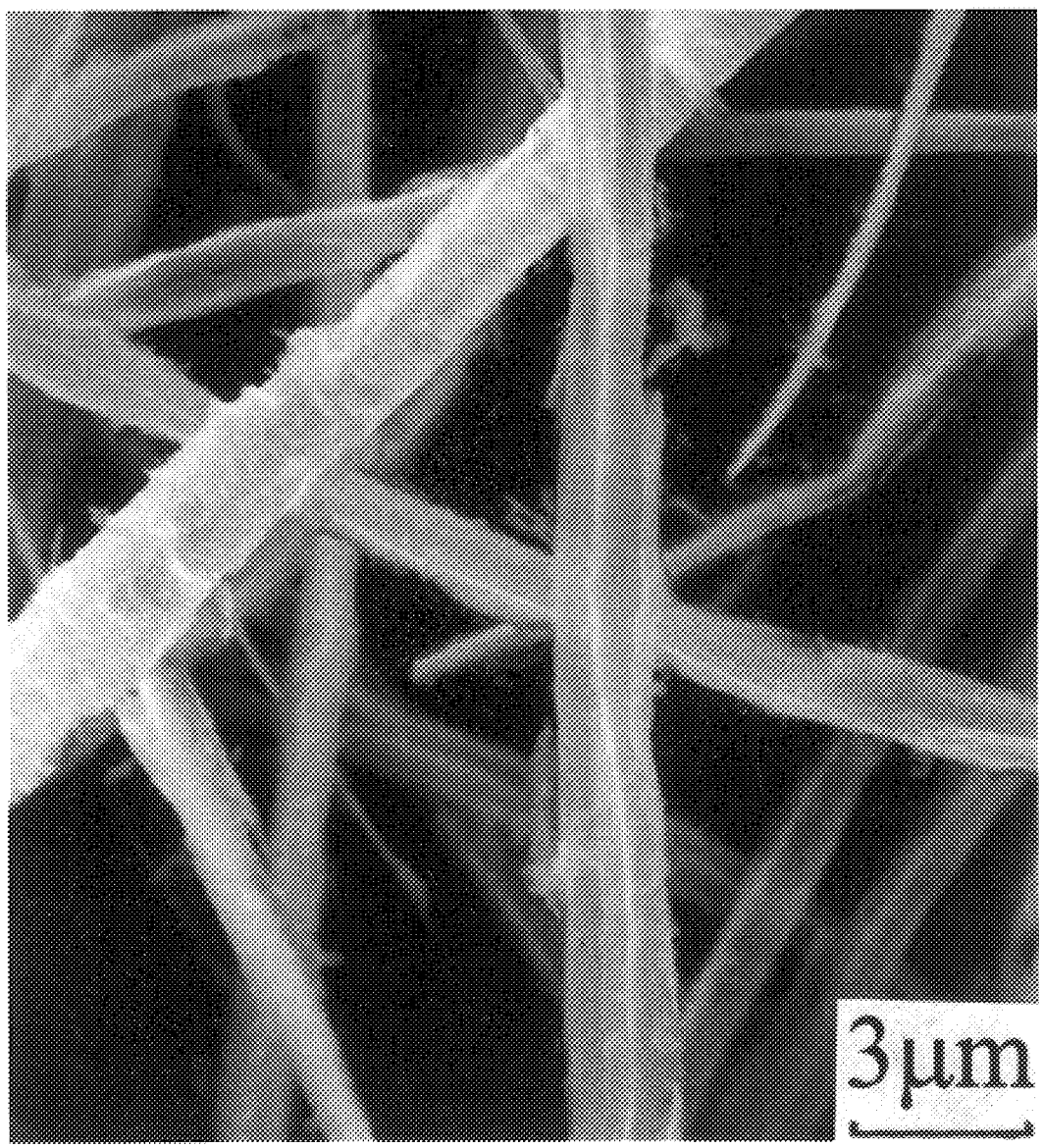
FIG. 3(a)–3(b) are SEM photographs of Ni fibers of diameter 2 μm at two magnifications.
Figure 3B:
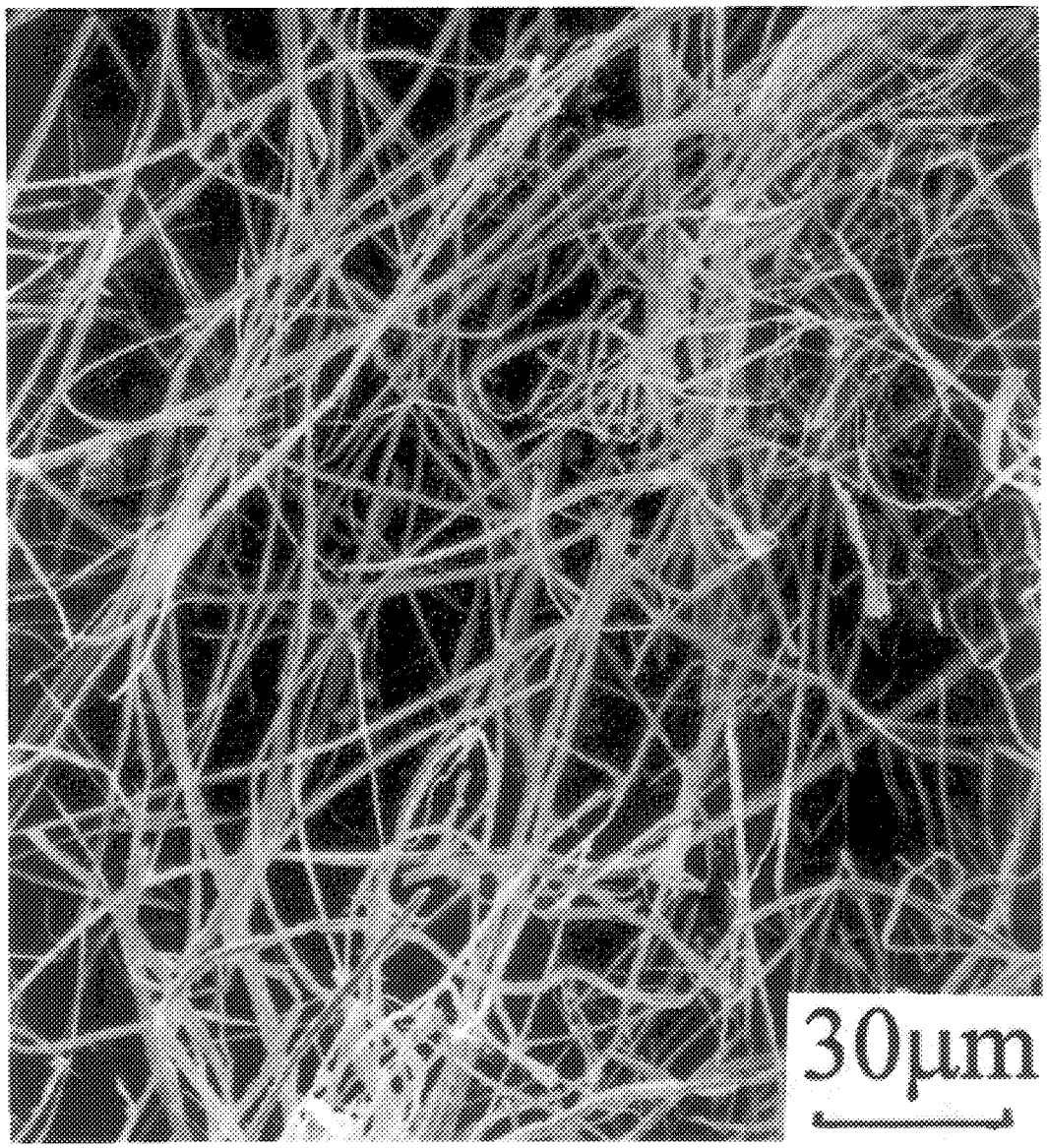
Figure 4A:
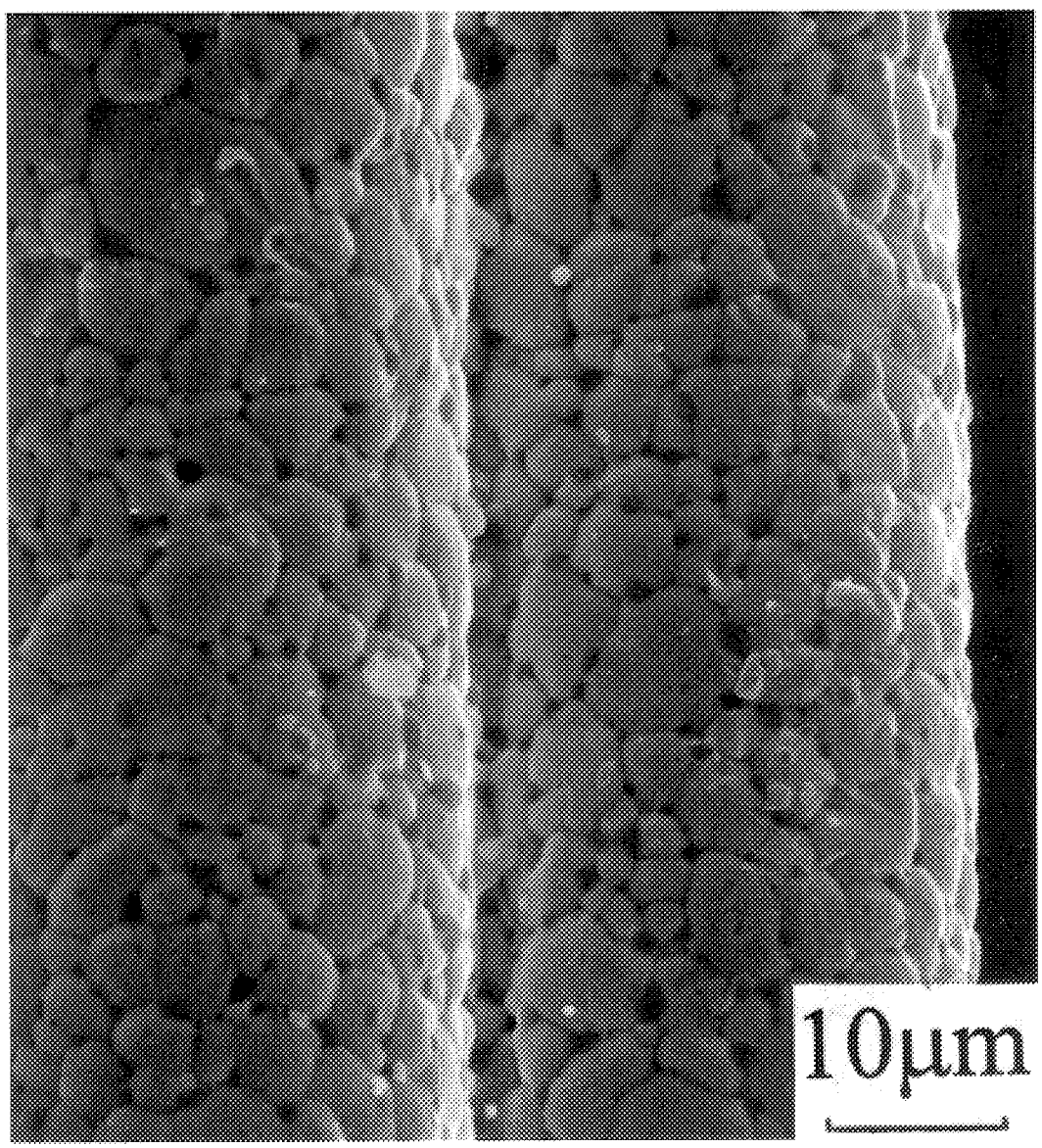
FIG. 4(a)–4(b) are SEM photographs of Ni fibers of diameter 20 μm at two magnifications.
Figure 4B:
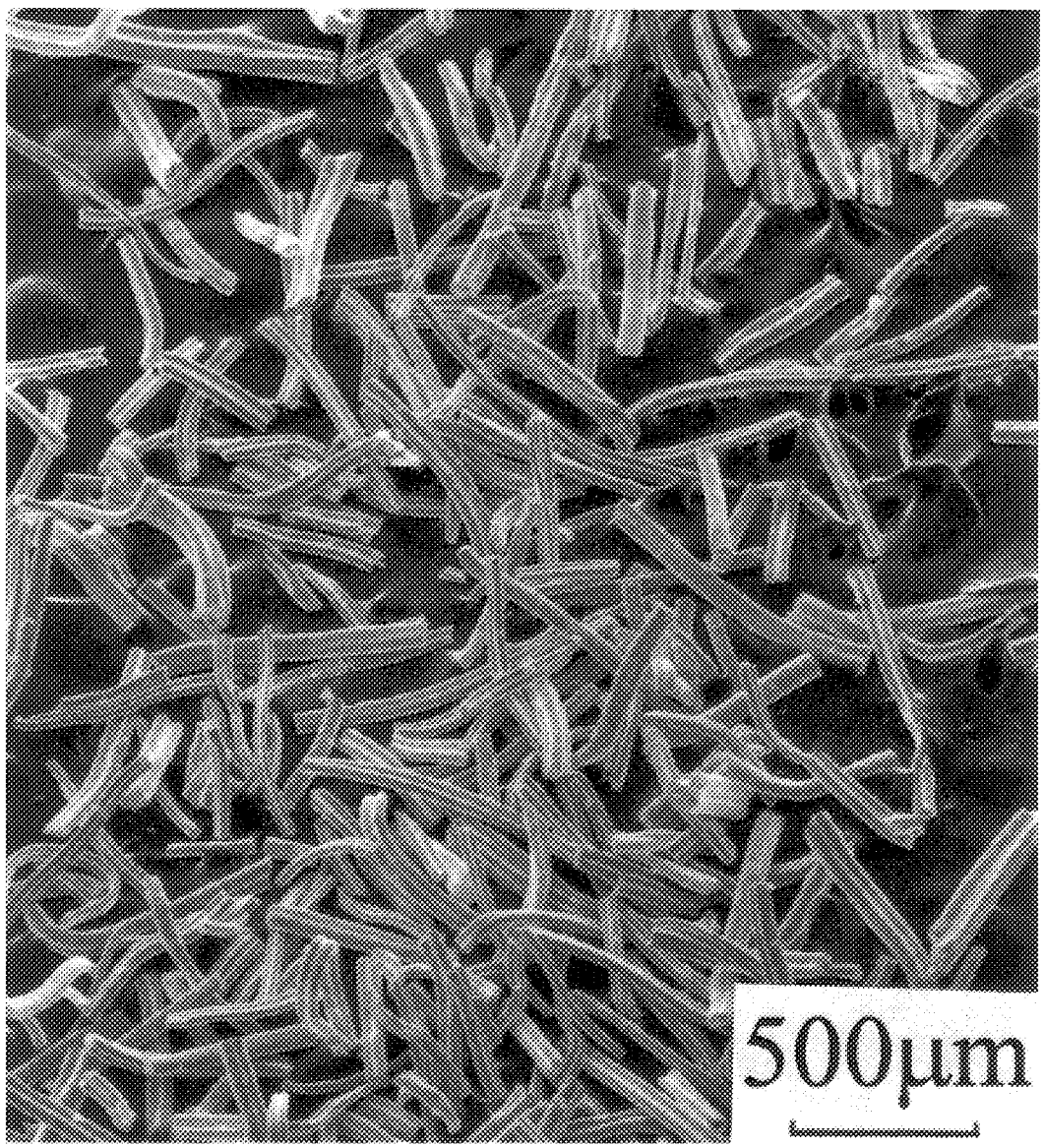

The volume electrical resistivity of the composites was measured by the four-probe method, using silver paint as electrical contacts. FIG. 2 and Table II give the resistivity vs. filler volume fraction for various PES-matrix composites. The Ni filaments were slightly less effective than the Ni fibers of diameter 2 μm but much more effective than the Ni fibers of diameter 20 μm in providing low resistivity. That the Ni filaments of diameter 0.4 μm were slightly less effective than the Ni fibers of diameter 2 μm is because the cross-sectional area of the Ni filaments (FIG. 1(c)–1(d)) is not as uniform as that of the Ni fibers (FIG. 3(a)–3(b)) and probably also because the resistivity of the Ni filaments is higher than that of the Ni fibers. That the Ni filaments were much more effective than the Ni fibers of diameter 20 μm (FIG. 4(a)–4(b)) is because of their large aspect ratio (250 for Ni filaments and 50 for Ni fibers). The difference in effectiveness for providing composites of low resistivity between the Ni filaments and the Ni fibers of diameter 20 μm decreased with increasing filler volume fraction. At all filler volume fractions, the carbon filaments, though smaller in diameter and more uniform in cross-sectional area (FIG. 1(a)–1(b)), were less effective than the Ni filaments because of their high resistivity.

Figure 5:
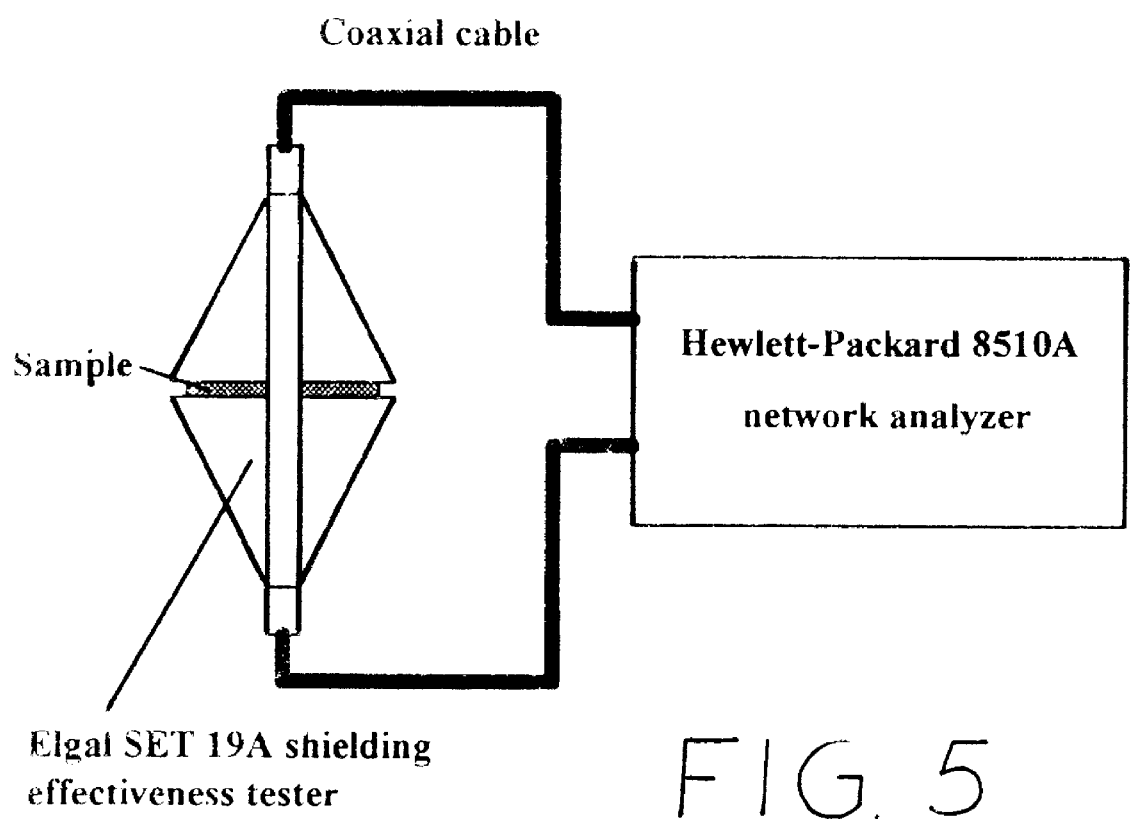
FIG. 5 is a schematic showing the experimental set-up for measuring the EMI shielding effectiveness.
Figure 6:
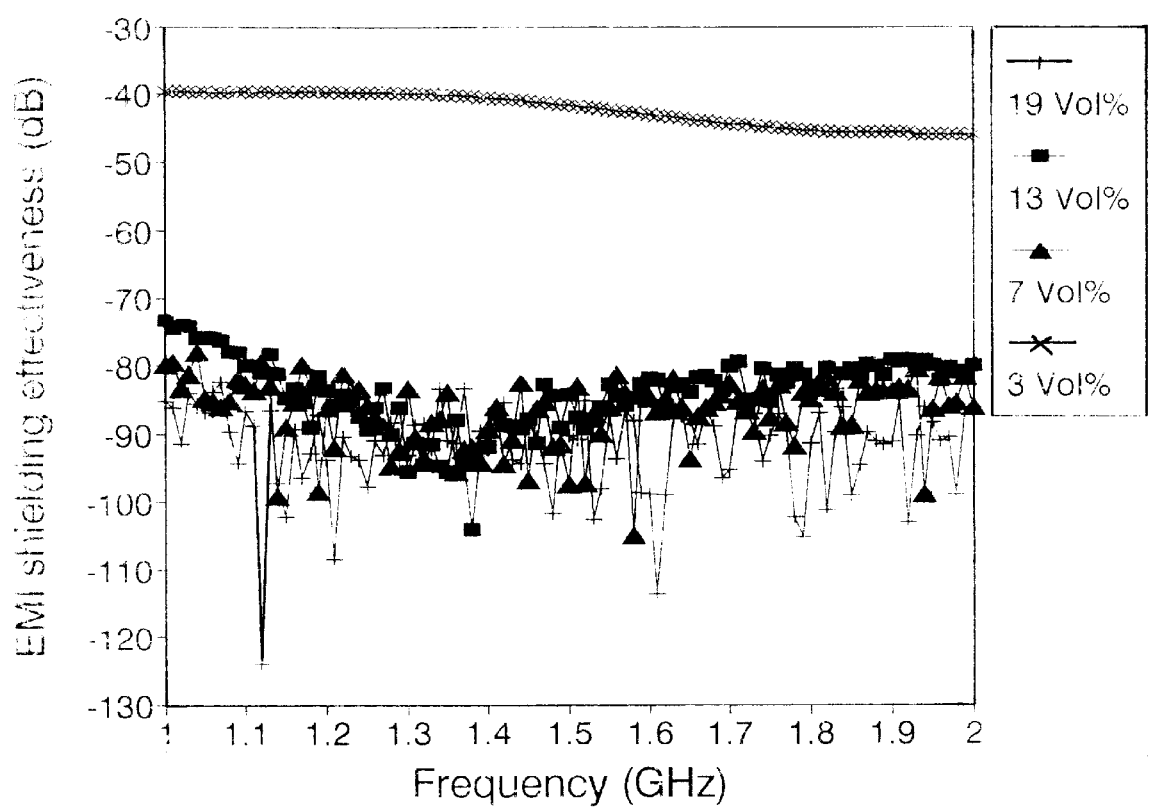
FIG. 6 is a graph of the EMI shielding effectiveness vs. frequency for composites containing Ni filaments at various volume fractions.
Figure 7:
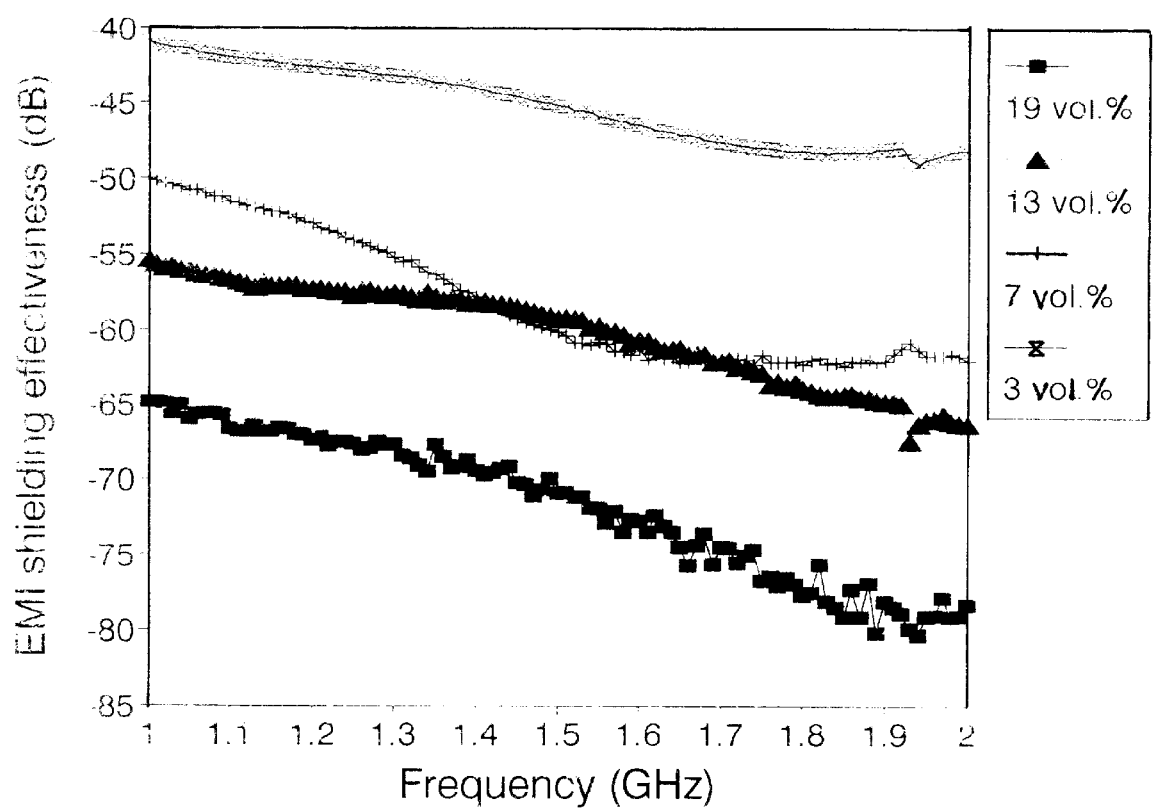
FIG. 7 is a graph of the EMI shielding effectiveness vs. frequency for composites containing 2 μm diameter Ni fibers at various volume fractions.
Figure 8:
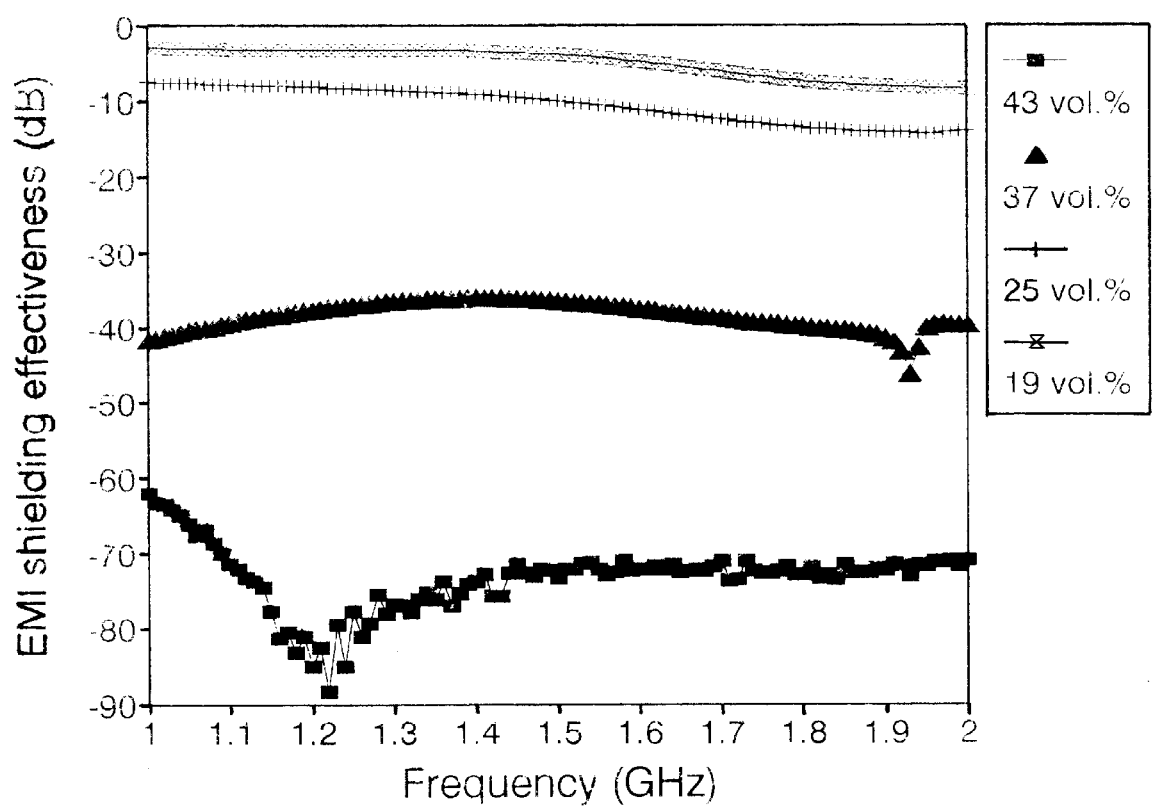
FIG. 8 is a graph of the EMI shielding effectiveness vs. frequency for composites containing 20 μm diameter Ni fibers at various volume fractions.
Figure 9:
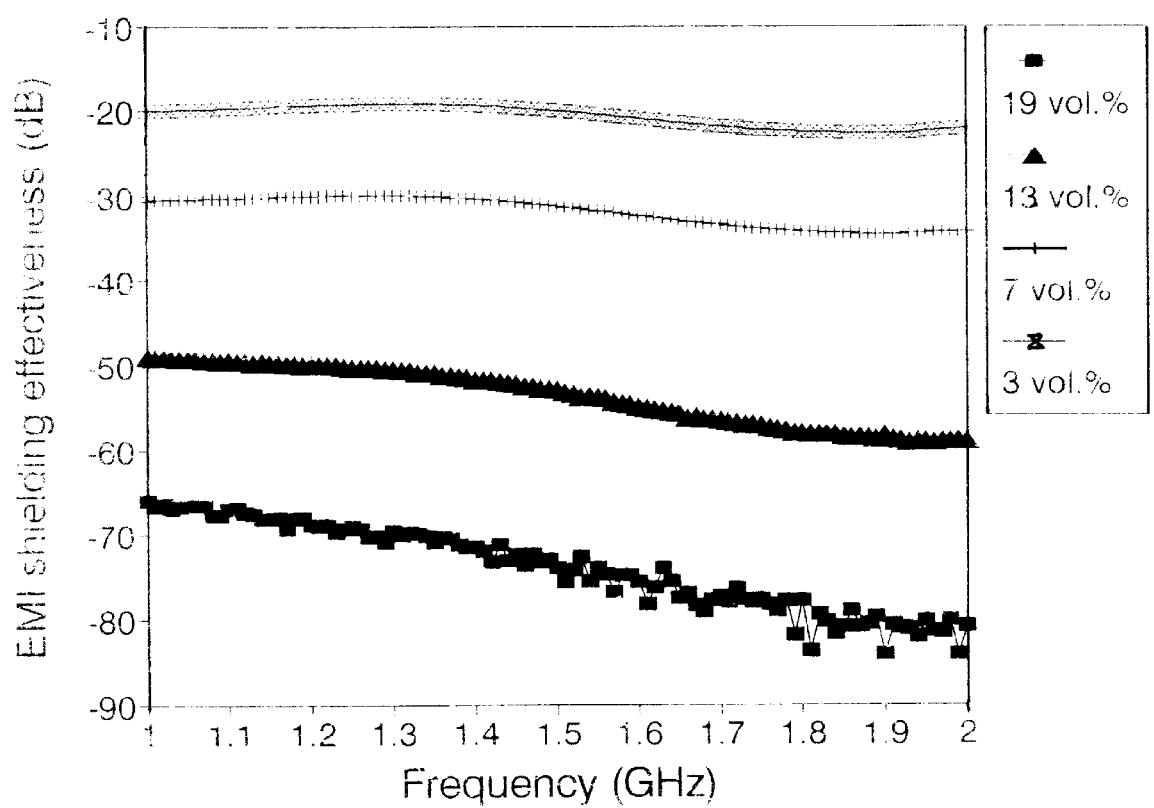
FIG. 9 is a graph of the EMI shielding effectiveness vs. frequency for composites containing carbon filaments at various volume fractions.

The EMI shielding effectiveness was measured using the coaxial cable method (FIG. 5). The sample was in the form of an annular ring of outer diameter 3.8 in (97 mm) and inner diameter 1.25 in (32 mm). The sample thickness was 2.85 mm for all the composites, 3.1 mm for solid copper and 4.0 mm for solid stainless steel. The frequency was scanned from 1 to 2 GHz such that 101 shielding effectiveness data points were taken within this frequency range. The average of these 101 data for each sample is shown in Table III, together with the standard deviation of these 101 data in parentheses. FIG. 6–9 give all the data for each composite sample. The error of each data point was better than ±1 dB at <10 dB, and ±5 dB at >70 dB; the error increased with increasing attenuation (dB).

Table II shows that, at the same filler volume fraction, the shielding effectiveness was highest for the Ni filaments. At 7 vol. %, the advantage of the Ni filaments compared to the other filaments was most significant. The shielding effectiveness attained by the Ni filaments at 7–19 vol. % was comparable to those of copper and stainless steel, which were thicker than the composites. Even at 43 vol. %, the 20 $\mu$m diameter Ni fibers gave lower shielding effectiveness than the Ni filaments at 7 vol. %. Even at 19 vol. %, the 2 $\mu$m diameter Ni fibers and the carbon filaments gave lower shielding effectiveness than the Ni filaments at 7 vol. %. The high shielding effectiveness associated with the Ni filaments is attributed to the combination of small diameter (smaller than the Ni fibers) and low resistivity (lower than all except the 2 $\mu$m diameter Ni fibers) of the Ni filaments.

The shielding effectiveness of the composite with 13 vol. % carbon filaments is higher than that of the composite with ~45 vol. % carbon filaments reported by Katsumata et al. (1993). This difference is attributed to the difference in composite processing and to the difference in the carbon filaments used.

While Example I has considered nickel as the metal, other metals such as copper, cobalt, silver, gold, tin and zinc can be substituted therefor.

While Example I has considered the use of carbon filaments as the core of metal-coated filaments, other filaments such as ceramic filaments can be substituted therefor.

While Example I has considered forming the metal coating on the filaments by electroplating, other processes such as electroless plating, chemical vapor deposition and physical vapor deposition can be substituted therefor.

While Example I has considered the use of acetone as a solvent to remove the contaminant in the form of mainly polyaromatic hydrocarbon from the surface of carbon filaments, other solvents such as methylene chloride and toluene may be substituted therefor.

While Example I has considered composite materials with polyether sulfone as the polymer matrix, other polymers (such as silicone, polyimide, polyvinylidene fluoride and epoxy), ceramics (such as Portland cement, silicates, phosphates, silicon carbide, silicon nitride, aluminum nitride and titanium diboride) or polymer-ceramic combinations (such as latex-cement combinations) may be substituted for polyether sulfone.

TABLE I

Properties of polyether sulfone polymer

| | |
|---|---|
| $T_g$ | 220–222° C. |
| Density | 1.37 g/cm$^3$ |
| Particle size | 100–150 $\mu$m |
| Tensile strength | 45.93 ± 1.12 MPa |
| Tensile modulus | 2.64 ± 0.19 GPa |
| Elongation at break | (3.1 ± 0.3) % |
| Electrical resistivity | >10$^{10}$ $\Omega$.cm |
| Coefficient of thermal expansion | 55 × 10$^{-6/K}$ |

TABLE II

Electrical resistivity of composites with different fillers

| Filler | Resistivity of composites ($\Omega$.cm) | | | |
|---|---|---|---|---|
| vol. % | Ni filaments | 2 $\mu$m Ni fibers | 20 $\mu$m Ni fibers | C filaments |
| 3 | 5.00 × 10$^{-1}$ | 2.40 × 10$^{-2}$ | 2.20 × 10$^7$ | 1.16 × 10$^2$ |
| 7 | 2.20 × 10$^{-2}$ | 2.50 × 10$^{-3}$ | 2.20 × 10$^3$ | 3.78 × 10$^0$ |
| 13 | 3.50 × 10$^{-3}$ | 6.90 × 10$^{-4}$ | 2.20 × 10$^0$ | 3.68 × 10$^{-1}$ |
| 19 | 1.50 × 10$^{-3}$ | 2.90 × 10$^{-4}$ | 5.30 × 10$^{-2}$ | 1.16 × 10$^{-1}$ |
| 25 | 9.58 × 10$^{-4}$ | 2.10 × 10$^{-4}$ | 5.00 × 10$^{-3}$ | 6.22 × 10$^{-2}$ |
| 37 | 4.16 × 10$^{-4}$ | 1.35 × 10$^{-4}$ | 6.60 × 10$^{-4}$ | 3.57 × 10$^{-2}$ |
| 43 | 2.81 × 10$^{-4}$ | 1.06 × 10$^{-4}$ | 2.80 × 10$^{-4}$ | / |

TABLE III

EMI shielding effectiveness (dB), averaged in the range 1–2 GHz. The standard deviations are shown in parentheses.

| | 3 vol. % | 7 vol. % | 13 vol. % | 19 vol. % | 25 vol. % | 37 vol. % | 43 vol. % |
|---|---|---|---|---|---|---|---|
| Ni filaments | 42.2(2.4) | 86.6(5.1) | 83.7(5.3) | 91.7(6.6) | | | |
| C filaments | 20.6(1.3) | 31.8(1.7) | 53.6(3.5) | 73.9(5.1) | | | |
| 2 $\mu$m Ni fibers | 45.2(2.5) | 58.1(4.2) | 60.3(3.2) | 71.7(4.6) | | | |
| 20 $\mu$m Ni fibers | | | | 4.9(1:9) | 10.5(2.3) | 38.4(1.9) | 73.7(4.4) |

We claim as our invention:

1. A material comprising filaments, each filament comprising a metal and an essentially coaxial core, each filament having a diameter less than 6 $\mu$m, each core comprising essentially carbon, such that the incorporation of 7 percent volume of this material in a matrix that is incapable of electromagnetic interference shielding results in a composite that is substantially equal to copper in electromagnetic interference shielding effectiveness at 1–2 GHz.

2. The material of claim 1, wherein said metal is selected from the group consisting of nickel, copper, cobalt, silver, gold, tin, zinc, nickel-based alloys, copper-based alloys, cobalt-based alloys, silver-based alloys, gold-based alloys, tin-based alloys and zinc-based alloys.

3. The material of claim 1, wherein said core has a diameter less than 5 μm.

4. The material of claim 1, wherein said carbon comprises graphite.

5. The material of claim 4, wherein said carbon is made from one or more carbonaceous gases.

6. The material of claim 4, wherein said core has a diameter less than 5 μm.

7. The material of claim 1, wherein the filaments are dispersed in a matrix to form a composite material, said matrix being selected from the group consisting of polymers, ceramics, and polymer-ceramic combinations.

8. The material of claim 1, wherein the filaments are dispersed in a matrix to form a composite material, said filaments comprising less than 80 percent volume of said composite material.

9. A material comprising filaments, said filaments comprising a metal and an essentially coaxial core, such that the core comprises essentially carbon, has a diameter less than 5 μm, is made from one or more carbonaceous gases and the interface between core and metal contains essentially no polyaromatic hydrocarbon.

10. The material of claim 9, wherein said metal is selected from the group consisting of nickel, copper, cobalt, silver, gold, tin, zinc, nickel-based alloys, copper-based alloys, colbalt-based alloys, silver-based alloys, gold-based alloys, tin-based alloys and zinc-based alloys.

11. A composite material comprising the material of claim 9 dispersed in a matrix, which is selected from the group consisting of polymers, ceramics and polymer-ceramic combinations.

12. The material of claim 9, wherein the filaments are dispersed in a matrix to form a composite material, said filaments comprising less than 80 percent volume of said composite material.

13. A material comprising filaments, wherein each of said filaments has a diameter less than 6 μm and comprises a metal and an essentially coaxial core, such that the core comprises essentially carbon, is made from one or more carbonaceous gases and the interface between core and metal contains essentially no polyaromatic hydrocarbon.

14. The material of claim 13, wherein said metal is selected from the group consisting of nickel, copper, cobalt, silver, gold, tin, zinc, nickel-based alloys, copper-based alloys, cobalt-based alloys, silver-based alloys, gold-based alloys, tin-based alloys and zinc-based alloys.

15. A composite material comprising the material of claim 13 dispersed in a matrix, which is selected from the group consisting of polymers, ceramics and polymer-ceramic combinations.

16. The material of claim 13, wherein the filaments are dispersed in a matrix to form a composite material, said filaments comprising less than 80 percent volume of said composite material.

\* \* \* \* \*

UNITED STATES PATENT AND TRADEMARK OFFICE
CERTIFICATE OF CORRECTION

PATENT NO.   : 5,827,997
DATED        : October 27, 1998
INVENTOR(S)  : Deborah D. L. Chung and Xiaoping Shui It is certified that error appears in the above-identified patent and that said Letters Patent is hereby corrected as shown below:

Column 1,
Line 4, before "BACKGROUND OF THE INVENTION," please insert the following:
-- GOVERNMENT SUPPORT
This invention was made with Government support under Grant N00014-14-91-J-4026 awarded by the Office of Naval Research. The Government has certain rights in the invention. --

Signed and Sealed this

Fourth Day of June, 2002

Attest:

Attesting Officer

JAMES E. ROGAN
Director of the United States Patent and Trademark Office